United States Patent
Onuki et al.

(10) Patent No.: US 10,833,111 B2
(45) Date of Patent: Nov. 10, 2020

(54) SOLID-STATE IMAGING APPARATUS

(71) Applicant: CANON KABUSHIKI KAISHA, Tokyo (JP)

(72) Inventors: Yusuke Onuki, Fujisawa (JP); Masahiro Kobayashi, Tokyo (JP); Takafumi Miki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/258,169

(22) Filed: Jan. 25, 2019

(65) Prior Publication Data
US 2019/0157327 A1    May 23, 2019

Related U.S. Application Data

(63) Continuation of application No. 14/960,229, filed on Dec. 4, 2015, now Pat. No. 10,229,944.

(30) Foreign Application Priority Data

Dec. 16, 2014   (JP) ................................ 2014-254581

(51) Int. Cl.
*H01L 27/146*   (2006.01)

(52) U.S. Cl.
CPC .... *H01L 27/14612* (2013.01); *H01L 27/1463* (2013.01); *H01L 27/14603* (2013.01); *H01L 27/14623* (2013.01); *H01L 27/14643* (2013.01); *H01L 27/14656* (2013.01)

(58) Field of Classification Search
CPC .......... H01L 27/1612; H01L 27/14616; H01L 27/14603; H01L 27/14623; H01L 27/1463; H01L 27/14643; H01L 27/14656
See application file for complete search history.

(56) References Cited

U.S. PATENT DOCUMENTS

| | | | |
|---|---|---|---|
| 6,512,544 B1 * | 1/2003 | Merrill | H01L 27/1443 250/208.1 |
| 7,772,627 B2 * | 8/2010 | Hong | H01L 27/14609 257/292 |
| 9,887,217 B2 * | 2/2018 | Ahn | H01L 27/14614 |
| 2004/0251394 A1 * | 12/2004 | Rhodes | H01L 27/14603 250/208.1 |
| 2005/0012168 A1 * | 1/2005 | Hong | H01L 27/14609 257/428 |
| 2010/0073541 A1 * | 3/2010 | Kawahito | H01L 27/14609 348/311 |

* cited by examiner

*Primary Examiner* — Grant S Withers
(74) *Attorney, Agent, or Firm* — Canon U.S.A., Inc. IP Division (57) ABSTRACT

An inventive solid-state imaging apparatus is provided which can improve the efficiency of the electric carrier transfer from a photoelectric conversion portion to an electric-carrier accumulation portion. The solid-state imaging apparatus includes an active region having the photoelectric conversion portion, the electric-carrier accumulation portion, and a floating diffusion, and an element isolation region having an insulator defining the active region. In planer view, the width of the active region in the electric-carrier accumulation portion under a gate of the first transfer transistor is larger than the width of the active region in the photoelectric conversion portion under the gate of the first transfer transistor.

13 Claims, 11 Drawing Sheets

SOLID-STATE IMAGING APPARATUS

CROSS-REFERENCE TO RELATED APPLICATIONS

This application is a continuation, and claims the benefit, of U.S. patent application Ser. No. 14/960,229, presently pending and filed on Dec. 4, 2015, and claims the benefit of Japanese Patent Application No. 2014-254581, filed Dec. 16, 2014, which applications are hereby incorporated by reference herein in their entireties.

BACKGROUND OF THE INVENTION

Field of the Invention

The present invention relates to a solid-state imaging apparatus.

Description of the Related Art

A configuration has been proposed which electronically controls exposure starts and exposure ends of all of a plurality of pixels each having a photoelectric conversion portion are arranged in row and column directions in a CMOS image sensor (global electronic shutter).

As a configuration for implementing such a global electronic shutter function, Japanese Patent Laid-Open No. 2008-103647 discloses an embodiment having an electric-carrier accumulation portion separately from a photoelectric conversion portion and floating diffusion within each of the pixels. With the configuration, electric carriers are transferred from the photoelectric conversion portion to the electric-carrier accumulation portion, and electric carriers are transferred from the electric-carrier accumulation portion to the floating diffusion.

SUMMARY OF THE INVENTION

In the configuration disclosed in Japanese Patent Laid-Open No. 2008-103647, when the difference in potential is small between the photoelectric conversion portion and the electric-carrier accumulation portion, there is a possibility that partial electrons present under a gate of a transfer transistor of electric carriers to be transferred from the photoelectric conversion portion to the electric-carrier accumulation portion may return to the photoelectric conversion portion without being transferred to the electric-carrier accumulation portion. This reduces the efficiency of the electric carriers transfer from the photoelectric conversion portion to the electric-carrier accumulation portion.

Accordingly, the present invention provides an inventive solid-state imaging apparatus which can improve the efficiency of transfer of electric carriers from the photoelectric conversion portion to the electric-carrier accumulation portion.

There is provided a solid-state imaging apparatus according to the present invention in which a plurality of pixels are laid out in a matrix form, each of the pixels having an imaging region having a photoelectric conversion portion, a first transfer transistor configured to transfer electric carriers from the photoelectric conversion portion, an electric-carrier accumulation portion to which the electric carriers are transferred from the first transfer transistor, a second transfer transistor configured to transfer electric carriers accumulated in the electric-carrier accumulation portion, and a floating diffusion to which the electric carriers are transferred from the second transfer transistor, the solid-state imaging apparatus including an active region having the photoelectric conversion portion, the electric-carrier accumulation portion, and the floating diffusion, and an element isolation region having an insulator defining the active region, and in planer view, the width of the active region in the electric-carrier accumulation portion under a gate of the first transfer transistor is larger than the width of the active region in the photoelectric conversion portion under the gate of the first transfer transistor.

Further features of the present invention will become apparent from the following description of exemplary embodiments (with reference to the attached drawings).

DESCRIPTION OF THE EMBODIMENTS

First Exemplary Embodiment

A first exemplary embodiment according to the present invention will be described with reference to FIGS. 1A to 1C to FIG. 3. It should be noted that positive holes may be used as signal electric carriers though electrons are used as signal electric carriers below. When electrons are used as signal electric carriers, a first conductivity type is an n-type, and a second conductivity type is a p-type. When holes are used as signal electric carriers, the conductivity types of the semiconductor regions have the opposite conductivity types of those of the case where signal electric carriers are electrons.

In the following description of exemplary embodiments, the term "semiconductor substrate surface" refers to a principal surface of a semiconductor substrate having semiconductor regions configuring pixels. The term "semiconductor substrate" is a concept including not only a material substrate but also a member having a plurality of semiconductor regions. The terms "top" or "upper" refers to the direction close to the principal surface of the semiconductor substrate, and the term "bottom" or "lower" refers to the direction close to the back surface away from the principal surface of the semiconductor substrate, by which the relative positional relationship between predetermined regions and members may be identified.

Figure 1A:
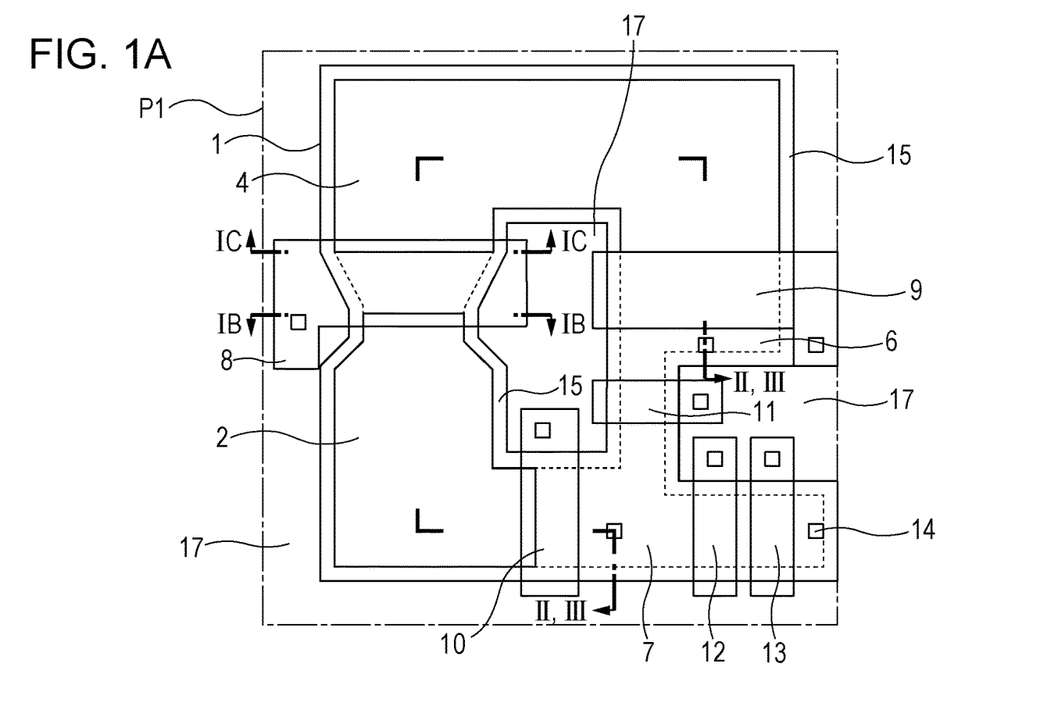
FIGS. 1A to 1C illustrate a pixel plan view and cross-section views according to a first exemplary embodiment.
Figure 1B:
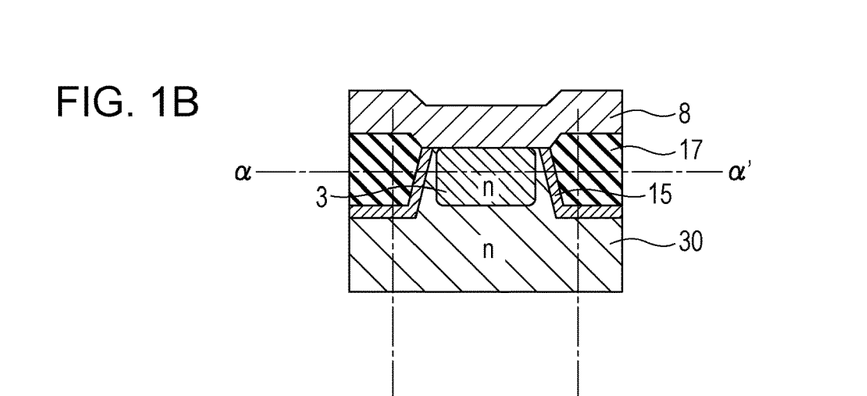
Figure 1C:
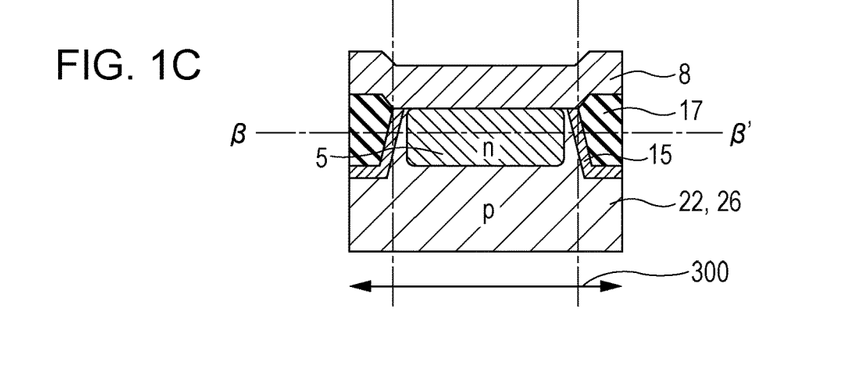
Figure 2A:
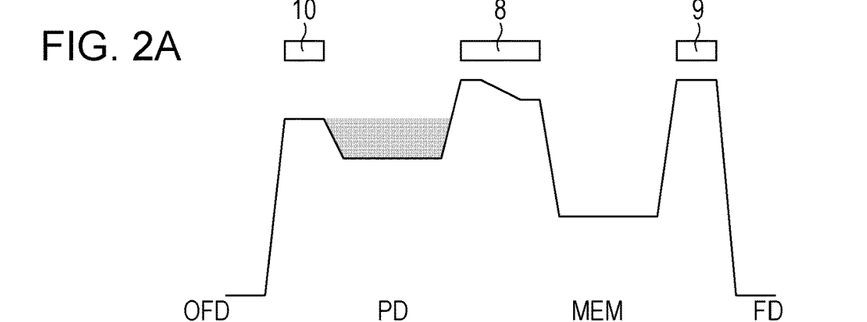
FIGS. 2A to 2D are potential cross-section views according to the first exemplary embodiment.
Figure 2B:
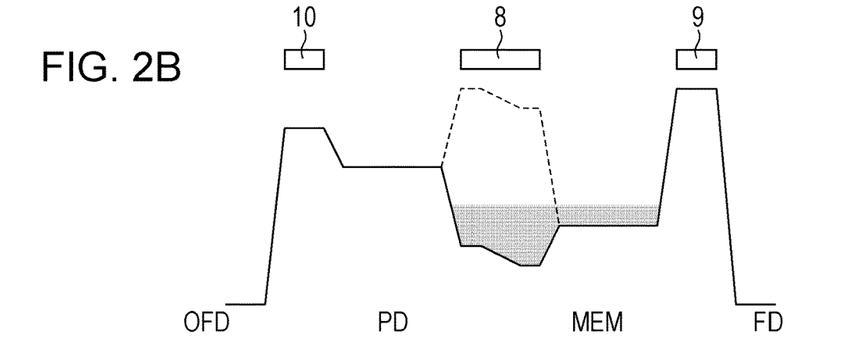
Figure 2C:
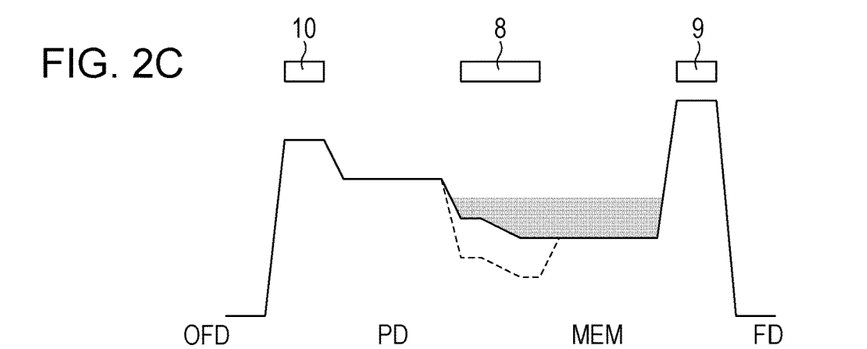
Figure 3:
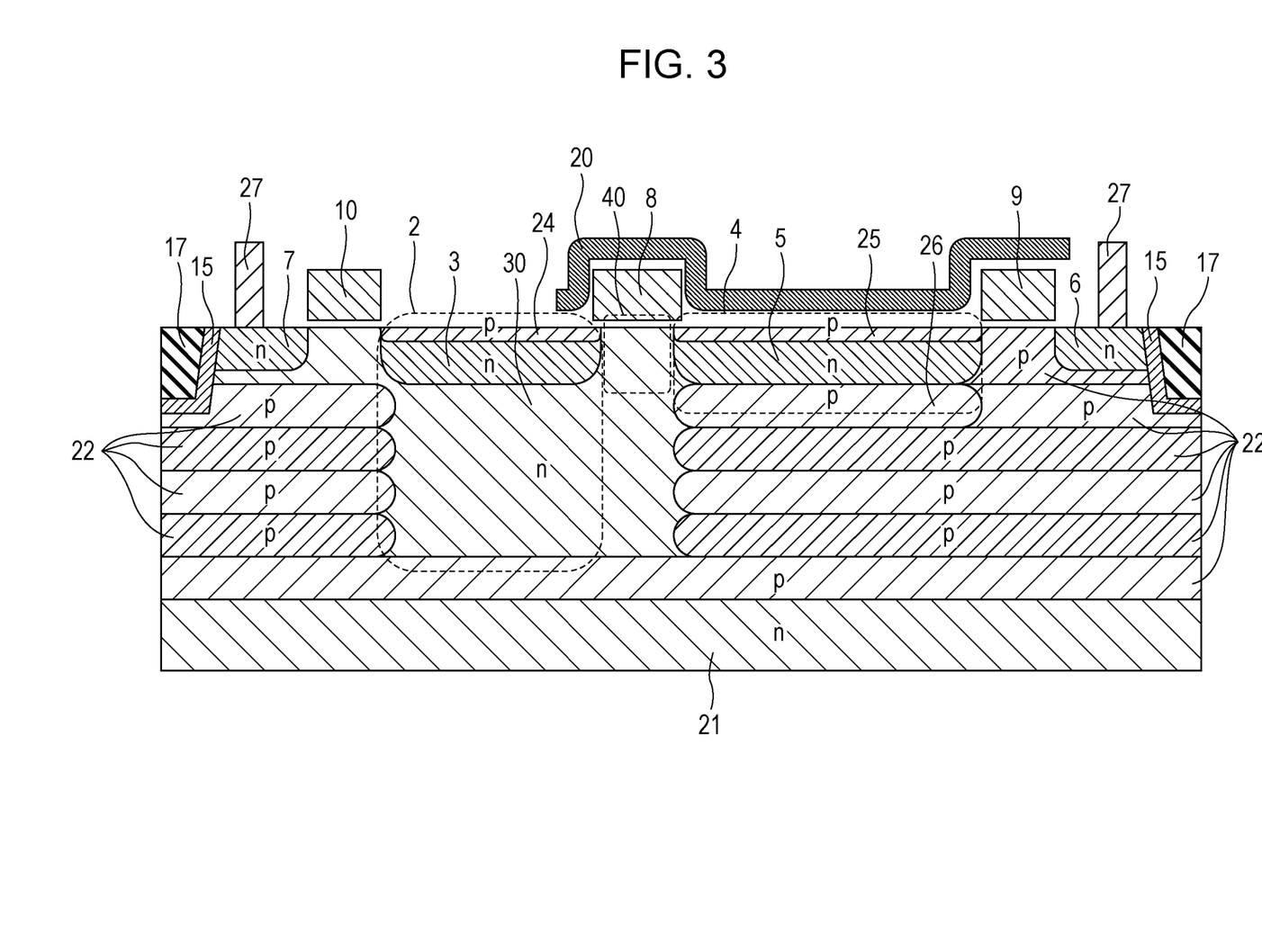
FIG. 3 is a cross-section view according to the first exemplary embodiment.

FIG. 1A is a diagram (plan view) illustrating, in planer view, one of a plurality of pixels arranged in a matrix form in an imaging region of a solid-state imaging apparatus. FIG. 1B and FIG. 1C are cross-section views taken at lines IB-IB and IC-IC, respectively. FIGS. 2A to 2C are potential cross-section views taken at line II-II in FIG. 1A, and FIG. 3 is a cross-section view taken at line III-III in FIG. 1A.

Referring to FIG. 1A, a pixel P1 includes a photoelectric conversion portion 2, a first transfer transistor (including a gate 8) configured to transfer electric carriers from the photoelectric conversion portion 2, and an electric-carrier accumulation portion 4 configured to accumulate electric carriers transferred from the first transfer transistor. The pixel P1 further includes a second transfer transistor (including a gate 9) configured to transfer electric carriers from the electric-carrier accumulation portion 4, and, a floating diffusion (hereinafter, also called an "FD") 6 configured to accumulate electric carriers transferred from the second transfer transistor. The pixel P1 further include an overflow drain 7 (hereinafter, also called an "OFD") usable for outputting electric carriers from the photoelectric conversion portion 2, and an overflow transistor (including a gate 10) configured to transfer electric carriers to the OFD). The pixel P1 further includes a reset transistor (including a gate 11) connected to the FD 6, and a source follower transistor (including a gate 12) to which the FD 6 and the gate 12 are connected via a metallic wire. In addition, the pixel 1 further includes a row selecting transistor 13, and a signal output unit 14.

The active region 1 having the photoelectric conversion portion 2, electric-carrier accumulation portion 4, FD 6 and so on defines its range by an element isolation region 17 made of an insulator. The element isolation region 17 may be configured by an STI (Shallow trench isolation) or a LOCOS (Local oxidation of silicon), for example.

A p-type region 15 is provided in the element isolation region 17 of the active region 1. The active region 1 in the electric-carrier accumulation portion has a width larger than the width of the active region 1 in the photoelectric conversion portion under the gate 8 of the first transfer transistor.

Next, the cross-section view in FIG. 3 taken at line III-III in FIG. 1 will be described. According to this exemplary embodiment, the photoelectric conversion portion 2, electric-carrier accumulation portion 4, FD 6, and OFD 7 are provided inside of a p-type well 22. The p-type well 22 is formed on one principal surface of an n-type substrate 21 by ion implantation or epitaxial growth. A p-type substrate may be used instead of the n-type substrate 21 having the p-type well 22 thereon.

The gate 8 of the first transfer transistor configured to transfer electric carriers from the photoelectric conversion portion 2 to the electric-carrier accumulation portion 4, and the gate 9 of the second transfer transistor configured to transfer electric carriers from the electric-carrier accumulation portion 4 to the FD 6 are provided on the semiconductor substrate surface. The gate 10 of the overflow transistor configured to transfer electric carriers from the photoelectric conversion portion 2 to the OFD 7 is provided on the semiconductor substrate surface.

According to this exemplary embodiment, the photoelectric conversion portion 2 includes an n-type region 3, an n-type region 30, a p-type well 22, and a p-type region 24.

The n-type region 3 is provided in an inner part of the n-type region 30, and the n-type region 3 has a lower surface in contact with the n-type region 30. The n-type region 3 has an impurity concentration higher than the impurity concentration of the n-type region 30. The n-type region 30 forms a pn junction together with the p-type well 22 placed under the n-type region 30. The p-type region 24 is provided on the semiconductor substrate surface of the n-type region 3, and the upper surface of the n-type region 3 is in contact with the p-type region 24. The p-type region 24 on the n-type region 3 forms a pn junction. Thus, a so-called embedded type photodiode is provided, which reduces dark current caused by an interface structure against an oxidation film (not illustrated) formed on the substrate surface.

According to this exemplary embodiment, the electric-carrier accumulation portion 4 includes an n-type region 5, a p-type region 25, and a p-type region 26.

The p-type region 25 is provided on the n-type region 5. The p-type region 26 having an impurity concentration higher than that of the p-type well 22 is provided under the n-type region 5. The p-type region 26 forms a pn junction together with the n-type region 5. When electric carriers are transferred from the electric-carrier accumulation portion 4 to the FD 6, a reverse bias is applied to the n-type region 5, and the n-type region 5 is depleted. When the n-type region 5 is depleted, the depletion layer spreads also to the p-type region 26. The amount of spread of the depletion layer depends on the impurity concentration of the p-type region 26. Because the impurity concentration of the p-type region 26 is higher than the impurity concentration of the p-type well 22, the spread of the depletion layer to the p-type region 26 may be suppressed, compared to the case where only the p-type well 22 is provided, which can reduce the voltage for depleting.

A shielding member 20 is provided on the electric-carrier accumulation portion 4, the gate 8 of the first transfer transistor, and the gate 9 of the second transfer transistor.

A channel region 40 is provided at the bottom of the gate 8 of the first transfer transistor and serves to transfer electric carrier from the photoelectric conversion portion 2 to the electric-carrier accumulation portion 4 in a conductive state. The p-type region 15 functioning as a channel stop is provided under the element isolation region 17. The p-type region 15 is formed by a different process from that for the p-type well 22. A plug 27 is connected to the FD 6 and the OFD 7.

FIG. 1B is a cross-section view taken at line IB-IB in FIG. 1A and illustrating a plane having the n-type region 3 (viewed in the direction indicated by the arrow).

Referring to FIG. 1B, the n-type region 3 (first semiconductor region) having an impurity concentration higher than that of the n-type region 30 is provided on the n-type region 30. The p-type region 15 (third semiconductor region) extends in the element isolation region of the active region 1 along the boundary between the active region 1 and the element isolation region 17. The gate 8 of the first transfer transistor is provided thereon through a gate oxidation film (not illustrated). The p-type region 24 may exist under the gate 8, but it is omitted in figures.

FIG. 1C is a cross-section view taken at line IC-IC in FIG. 1A and illustrating a plane having the n-type region 5 (viewed in the direction indicated by the arrow).

Referring to FIG. 1C, the n-type region 5 (second semiconductor region) is provided on the p-type region 26. Like FIG. 1B, the p-type region 15 (third semiconductor region) is provided closer to the element isolation region 17 of the active region 1.

Comparing FIG. 1B and FIG. 1C, in a direction 300, the width of the n-type region 3 is smaller than the width of the n-type region 5. In general, for identifying the size of a channel region in a MOS transistor, the length in the direction of electric carrier transfer is called a channel length, and the length in the direction orthogonal to the direction of electric carrier transfer is called a channel width. According to this exemplary embodiment, the direction 300 illustrated in FIGS. 1B and 1C corresponds to the direction of the channel width of the channel region in the first transfer transistor. Accordingly, the direction will be called a channel width direction of the transfer transistor below, and FIGS. 1B and 1C are cross-section views in the channel width direction of the first transfer transistor.

Next, effects of the difference in width between the n-type region 3 and the n-type region 5 in the channel width direction 300 of the first transfer transistor will be described.

First of all, with reference to FIGS. 11A to 11C, potentials in the n-type region at a source or a drain of the n-type MOS transistor will be described.

Figure 11A:
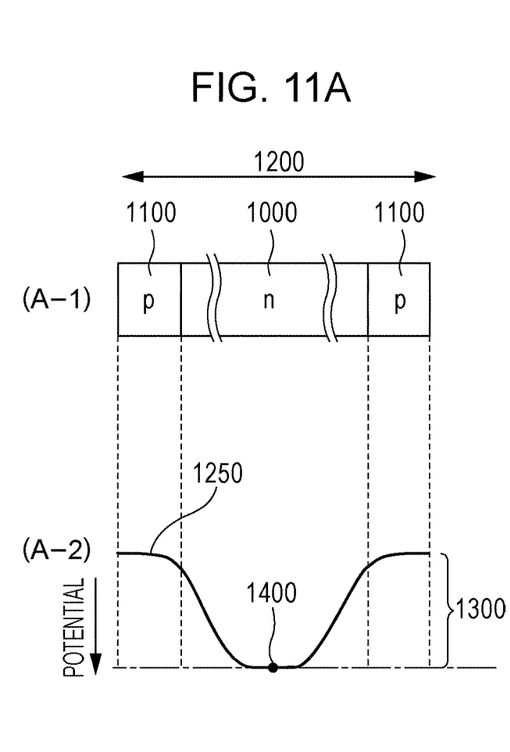
FIGS. 11A to 11C illustrate a pixel structure and potentials corresponding to the pixel structure.

FIGS. 11A(A-1) to 11C(C-1) are cross-section views in the channel width direction of the n-type MOS transistor illustrating the source or drain of the n-type MOS transistor viewed from the direction from the channel region to the source or from the channel region to the drain.

FIGS. 11A(A-1) to 11C(C-1) illustrate an n-type region 1000, a p-type region 1100, and a channel width direction 1200. In the channel width direction 1200, the width of the n-type region 1000 illustrated in FIG. 11A(A-1) is sufficiently larger than those in FIGS. 11B(B-1) and 11C(C-1). The n-type region 1000 illustrated in FIG. 11B(B-1) is smaller than the width of the n-type region 1000 in FIG. 11C(C-1).

FIGS. 11A(A-2) to 11C(C-2) illustrate potentials when the transistor is turned on in the structures illustrated in FIGS. 11A(A-1) to 11C(C-1). The positive direction of the potential is defined as a lower direction, and when the transferred electric carriers are electrons, the potential decreases in the lower direction.

Referring to FIGS. 11A(A-1) and 11A(A-2), because the n-type region 1000 is in contact with the p-type region 1100, the n-type region 1000 is influenced by the potential of the p-type region 1100 in the channel width direction 1200. FIG. 11A(A-2) illustrates a potential 1250 and a center 1400 of the bottom of the potential. When it is possible to increase the width of the n-type region 1000, the distance between the center 1400 of the bottom of the potential and the p-type region 1100 can be sufficiently provided. Thus, the center 1400 of the bottom of the potential is not significantly influenced by the potential of the p-type region 1200. Therefore, when the transistor is turned on, the potential at the center of the bottom of the potential is sufficiently low for electrons (indicated by reference 1300).

Figure 11B:
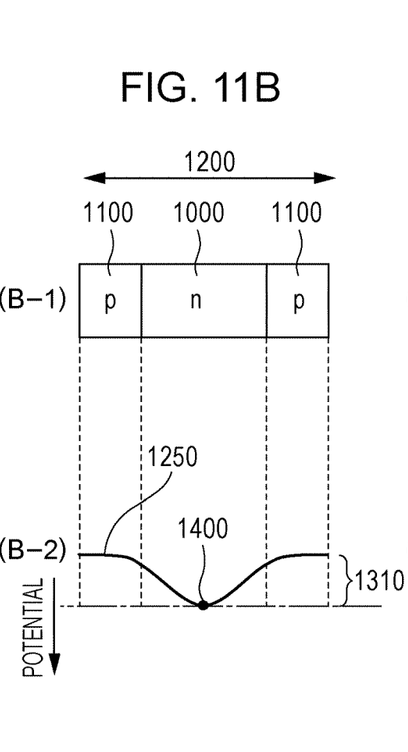

On the other hand, as illustrated in FIGS. 11B(B-2) and 11C(C-2), when the width of the n region 1000 in the channel width direction is not sufficiently large, the center 1400 of the bottom of the potential is influenced by the potential of the p-type region 1200 more than the case illustrated in FIG. 11A(A-2). Therefore, when the transistor is turned on, the center 1400 of the bottom of the potential in FIGS. 11B(B-2) and 11C(C-2) is not sufficiently low (as indicated by references 1310 and 1320).

According to the principle, when the n-type region of the source or the drain is sufficiently wide in the cross section in the channel width direction of the n-type MOS transistor, the center of the bottom of the potential is sufficiently low for electrons when the transistor is turned on.

Even when it is not possible to sufficiently increase the width of the n-type region 1000, the position of the center of the bottom of the potential may be changed in accordance with the magnitude relationship of the n-type region 1000. In other words, the center 1400 of the bottom of the potential in FIG. 11C(C-2) with the n-type region 1000 having a large width is positioned lower than the center 1400 of the bottom of the potential in FIG. 11B(B-2).

The pixel structure at line α-α' in FIG. 1B includes, from the left side, the element isolation region 17, the p-type region 15, the n-type region 30, the n-type region 3, the n-type region 30, and the p-type region 15. Comparing the structure in FIG. 1B and the structure in FIG. 11B(B-1), the n-type region 1000 in FIG. 11B(B-1) corresponds to the n-type region 3 and n-type region 30 in FIG. 1B. The p-type region 1100 in FIG. 11B(B-1) corresponds to the p-type region 15 in FIG. 1B.

It may be expressed here that the structure in FIG. 1B has the n-type region 3 (first semiconductor region) between the p-type regions 15 (third semiconductor regions) in the cross section in the channel width direction of the first transfer transistor. It may further be expressed that the n-type region 30 is placed between the p-type region 15 (third semiconductor region) and the n-type region 3 (first semiconductor region).

Figure 11C:
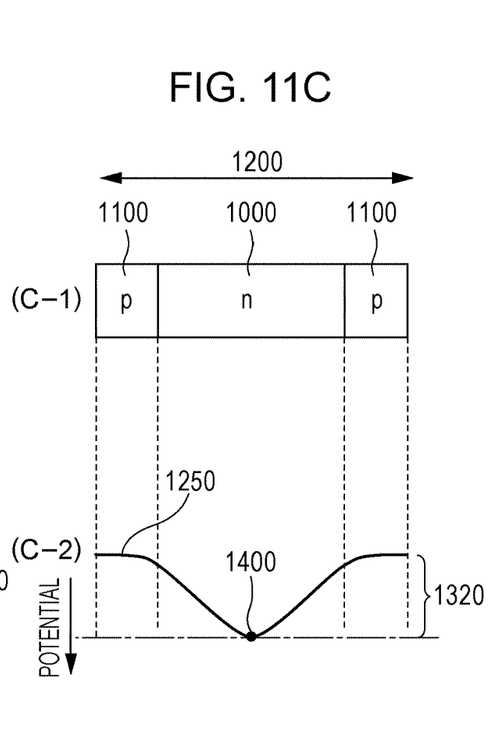

Similarly, in the pixel structure at line β-β' illustrated in FIG. 1C, the n-type region 1000 in FIG. 11C(C-1) corresponds to the n-type region 5 in FIG. 1C. The p-type region 1100 in FIG. 11C(C-1) corresponds to the p-type regions 22 and 26 and p-type region 15 in FIG. 1C. It may be expressed that the structure in FIG. 1C has the n-type region 5 (second semiconductor region) between the p-type regions 15 (third semiconductor region) on the cross section in the channel width direction of the first transfer transistor. It may be expressed that the p-type regions 22 and 26 are placed between the p-type region 15 (third semiconductor region) and the n-type region 5 (second semiconductor region).

According to this exemplary embodiment, as described above, the width of the n-type region 5 (second semiconductor region) placed between the p-type regions 15 (third semiconductor region) is larger than the width of the n-type region 3 (first semiconductor region) placed between the p-type regions 15 (third semiconductor region).

For that, when the first transfer transistor is turned on, the photoelectric conversion portion 2 has a lower potential for the electrons under the gate of the first transfer transistor than the potential of the electric-carrier accumulation portion 4. The potential structure of the channel of the first transfer transistor is similar to a structure acquired by serially connecting the potentials.

FIGS. 2A to 2D are potential diagrams taken at line II-II in FIG. 1A, and the downward direction of the figures corresponds to the positive direction of potentials. Referring to FIGS. 2A to 2D, PD indicates the potential of a portion corresponding to the photoelectric conversion portion 2, MEM indicates the potential of a portion corresponding to the electric-carrier accumulation portion 4, FD indicates the potential of a portion corresponding to the floating diffusion 6, and OFD indicates the potential of a portion corresponding to the overflow drain 7.

FIG. 2A is a potential diagram where electric carriers are accumulated in the photoelectric conversion portion 2 and where the gate 8 of the first transfer transistor and the gate 10 of the overflow transistor have an OFF state. Because the configuration as described above is applied according to this exemplary embodiment, a region under the gate 8 in the photoelectric conversion portion 2 has a lower potential than the potential of a region in the electric-carrier accumulation portion 4.

FIG. 2B is a potential diagram in which the gate 8 of the first transfer transistor has an ON state. Turning on the gate 8 of the first transfer transistor pushes down the potential under the gate 8 of the first transfer transistor so that electric carriers are transferred from the photoelectric conversion portion 2 to the electric-carrier accumulation portion 4. However, because the potential difference between the photoelectric conversion portion 2 and the electric-carrier accumulation portion 4 is small, not all of the electric carriers are transferred to the electric-carrier accumulation portion 4, but many electric carriers are captured by the potential under the gate 8 of the first transfer transistor pushed down by the first transfer transistor. Here, a potential structure is acquired in which the potential of a region in the photoelectric conversion portion 2 under the gate of the first transfer transistor is high while the potential of the electric-carrier accumulation portion 4 is low. Thus, electric carriers are captured by the bottom of the potential of the gate 8 of the first transfer transistor.

Figure 2D:
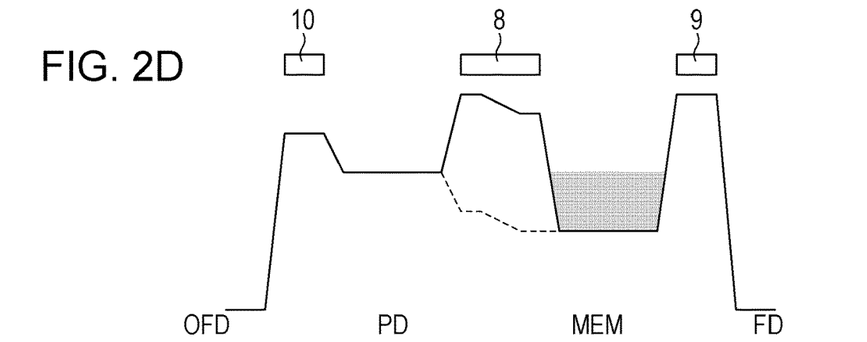

FIG. 2C is a potential diagram illustrating an intermediate process in which the first transfer transistor in FIG. 2B is switched from the ON state to an OFF state. FIG. 2D is a potential diagram illustrating a state acquired by turning off the gate 8 of the first transfer transistor so that electric carriers are transferred to the electric-carrier accumulation portion 4. Under the gate of the first transfer transistor, a potential structure is acquired in which a range in the photoelectric conversion portion 2 has a higher potential and the potential in the electric-carrier accumulation portion 4 is low. For that, when the potential of a region closer to the electric-carrier accumulation portion 4 is higher than that of a region in the photoelectric conversion portion 2 or when no potential difference exists between them, the efficiency of the electric carriers transfer from the photoelectric conversion portion 2 to the electric-carrier accumulation portion 4 is improved.

Comparing the pixel structure at the line α-α' in FIG. 1B and the pixel structure at line β-β' in FIG. 1C, the width of the active region 1 in the channel width direction 300 is larger in a region closer to the electric-carrier accumulation portion 4 than a region closer to photoelectric conversion portion 2.

Regarding the active region 1 in FIG. 1A, the widths of the p-type region 15 under the first transfer transistor are substantially equal in the photoelectric conversion portion 2 and in the electric-carrier accumulation portion 4. For that, the width of the active region 1 in the channel width direction may be used as a proxy variable for the width of the n-type region described above.

Therefore, in planer view, a larger width of the active region in the electric-carrier accumulation portion under the first transfer transistor than the width of the active region in the photoelectric conversion portion can improve the efficiency of the electric carriers transfer from the photoelectric conversion portion to the electric-carrier accumulation portion.

Second Exemplary Embodiment

With reference to FIGS. 4A to 4C and FIG. 5, a second exemplary embodiment will be described. This exemplary embodiment is different from the first exemplary embodiment in that the p-type region 15 is not provided and that the n-type region 3 is provided on the p-type region 22.

Figure 4A:
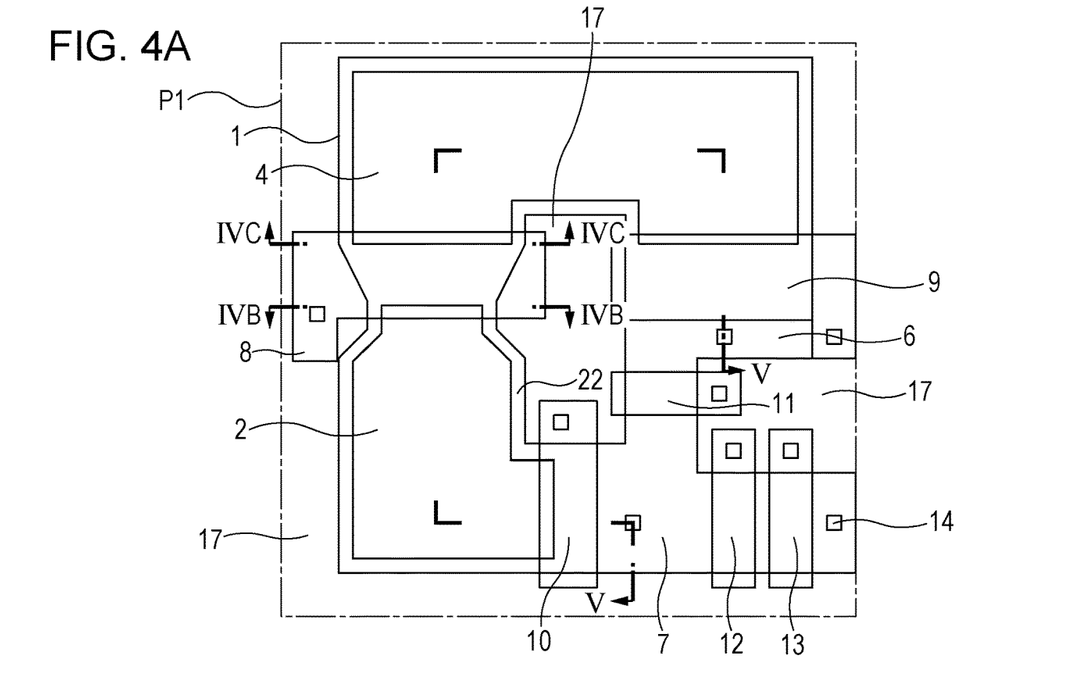
FIGS. 4A to 4C illustrate a pixel plan view and cross-section views according to a second exemplary embodiment.
Figure 4B:
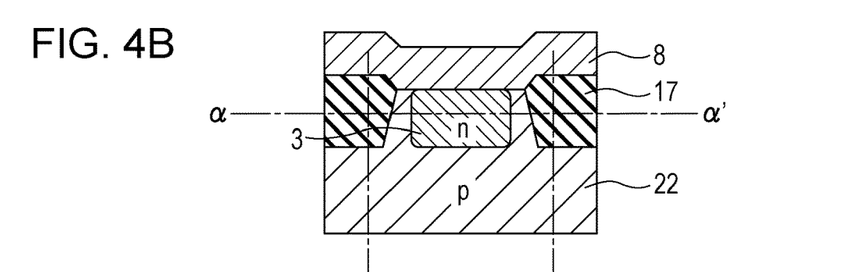
Figure 4C:
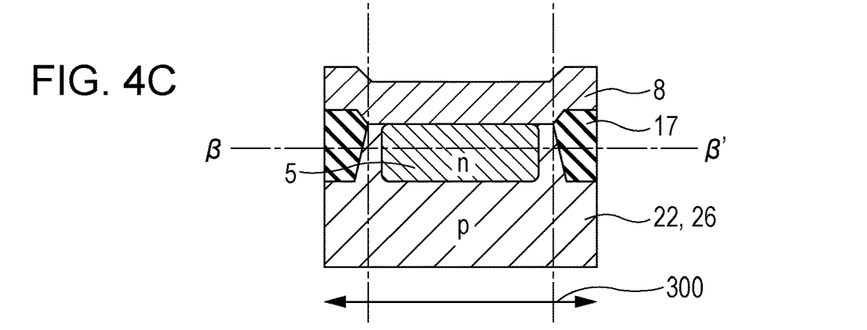
Figure 5:
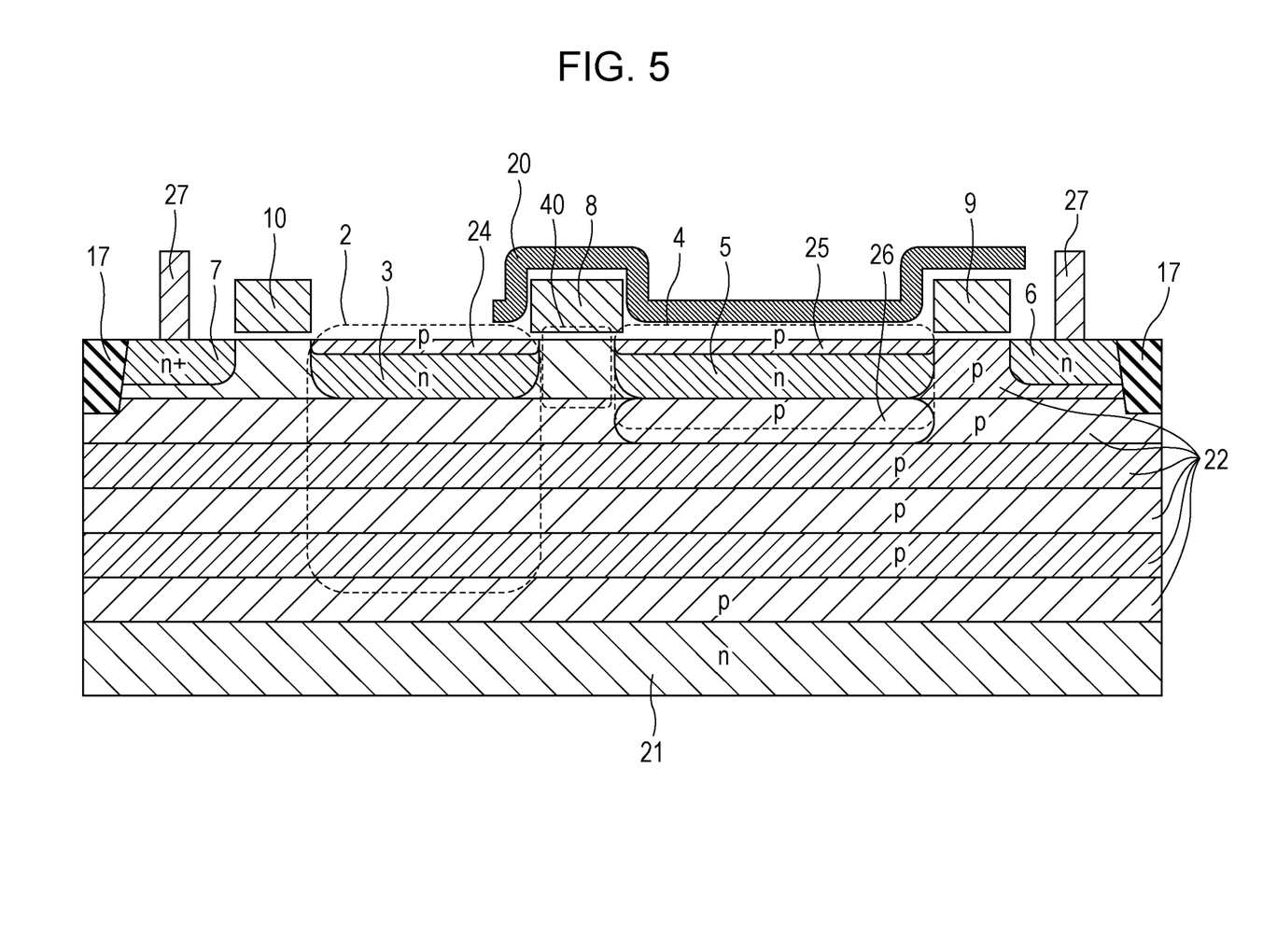
FIG. 5 is a cross-section view according to the second exemplary embodiment.

FIG. 4A is a plan view of a pixel, and FIGS. 4B and 4C are a cross-section view taken at line IVB-IVB and a cross-section view taken at line IVC-IVC, respectively, in FIG. 4A. FIG. 5 is a cross-section view taken at line V-V in FIG. 4A. Like numbers refer to like parts or regions throughout drawings according to the first and second exemplary embodiments.

Referring to FIG. 5, the photoelectric conversion portion 2 has the p-type well 22 under and around the n-type region 3, and a lower surface of the n-type region 3 is in contact with the p-type well 22. Correspondingly, FIGS. 4B and 4C also illustrate that the p-type well 22 and the p-type region 26 under the n-type region 3 and the n-type region 5.

The pixel structure illustrated in FIG. 4B taken at line IVB-IVB in FIG. 4A has the n-type region 3 as an n-type region and the p-type region 22 as a p-type region. The pixel structure illustrated in FIG. 4C taken at line IVC-IVC in FIG. 4A has the n-type region 5 as an n-type region and the p-type regions 22 and 26 as a p-type region. It may be expressed here that the structures in FIGS. 4B and 4C have the n-type region 3 (first semiconductor region) and the n-type region 5 (second semiconductor region) between the p-type regions 22, 26 (third semiconductor region) in the cross section in the channel width direction of the first transfer transistor.

According to this exemplary embodiment, in the cross section in the channel width direction of the first transfer transistor under the first transfer transistor, the n-type region 5 (second semiconductor region) in the electric-carrier accumulation portion has a larger width than the width of the n-type region 3 (first semiconductor region) in the photoelectric conversion portion. This can improve the efficiency of the electric carrier transfer from the photoelectric conversion portion to the electric-carrier accumulation portion.

In the active region 1 illustrated in FIG. 4A, the widths of the p-type region 22 under the first transfer transistor are substantially equal in the photoelectric conversion portion and in the electric-carrier accumulation portion. For that, the width of the active region 1 in the channel width direction 300 can be used as a proxy variable for the width of the n-type region 3 and n-type region 5. Therefore, in planer view, a larger width of an active region in the electric carriers accumulating unit under the first transfer transistor than the width of an active region in the photoelectric conversion portion can improve the efficiency of the electric carrier transfer from the photoelectric conversion portion to the electric-carrier accumulation portion.

Third Exemplary Embodiment

Figure 6:
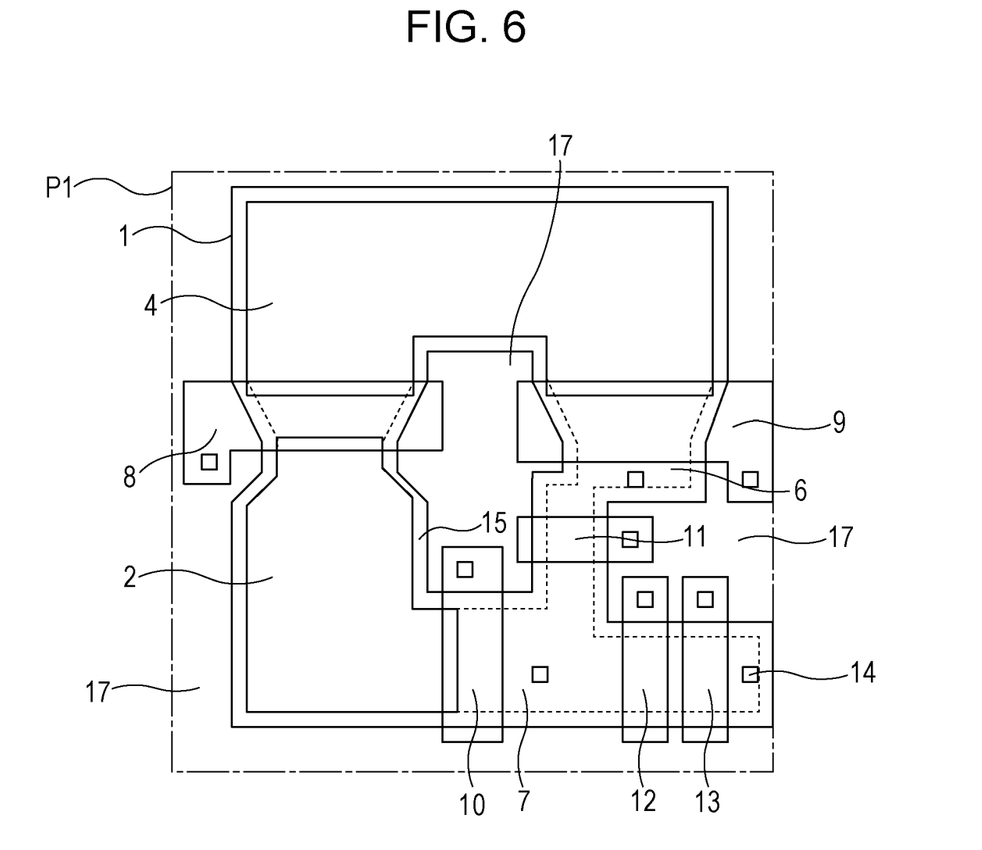
FIG. 6 is a pixel plan view according to third exemplary embodiment.

With reference to FIG. 6, a third exemplary embodiment will be described. This exemplary embodiment is different from the first exemplary embodiment in that the width of the active region in an electric-carrier accumulation portion under a second transfer transistor in planer view is larger than the width of the active region in a floating diffusion.

According to this exemplary embodiment, because electrons of electric carriers are accumulated in the photoelectric conversion portion, a reduced width of the n region in the FD 6 can reduce the area of the FD 6 and can reduce the capacity of the FD 6. Because a reduced capacity of the FD 6 can suppress signal amplification in a peripheral circuit to some extent, the noise component can also be reduced.

In the electric carriers transfer from the electric-carrier accumulation portion 4 to the FD 6, voltage corresponding to the power supply voltage is normally applied to the FD 6 which thus has a potential largely different from the potential of the electric-carrier accumulation portion 4. Therefore, the problem regarding the efficiency of the electric carrier transfer which may possibly occur when electric carriers are transferred from the photoelectric conversion portion 2 to the electric-carrier accumulation portion 4 may not relatively easily occur when electric carriers are transferred from the electric-carrier accumulation portion 4 to the FD 6. According to this exemplary embodiment, the relationship between the photoelectric conversion portion 2 and the electric-carrier accumulation portion 4 regarding the widths of the active region is inverse to the relationship between the electric-carrier accumulation portion 4 and the FD 6, and the width of the active region 1 in the FD is smaller than the width of the active region 1 in the electric-carrier accumulation portion.

Fourth Exemplary Embodiment

Figure 7A:
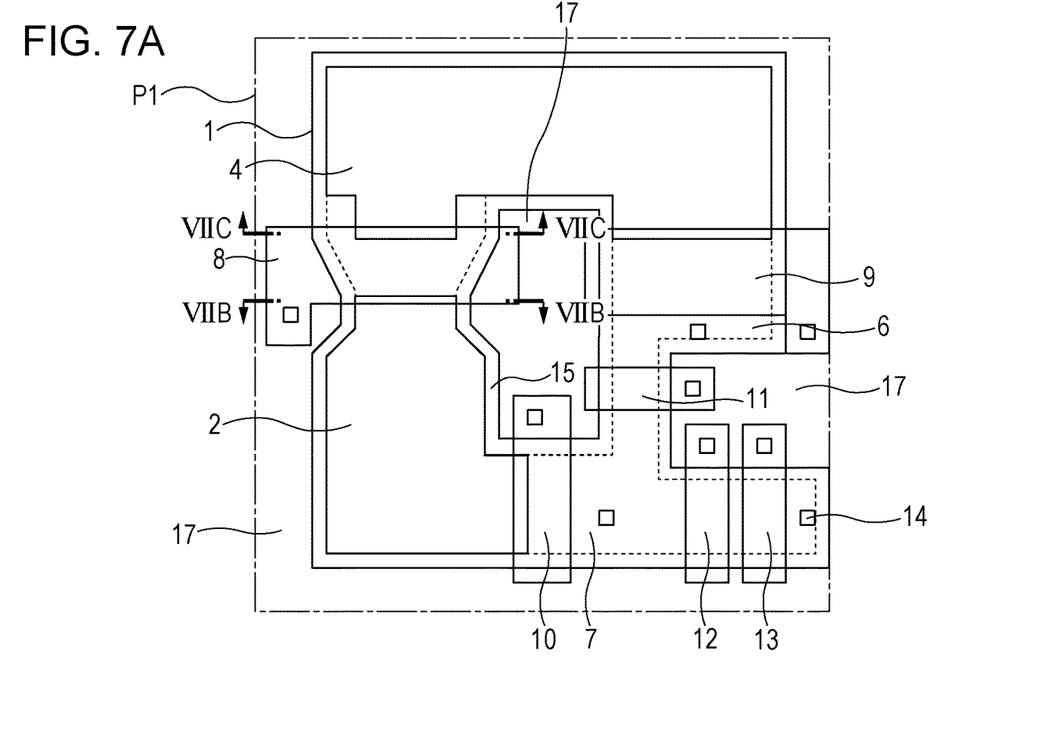
FIGS. 7A to 7C illustrate a pixel plan view and a cross-section view according to a fourth exemplary embodiment.
Figure 7B:
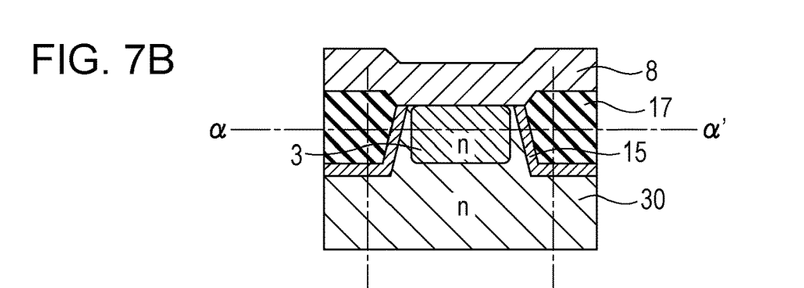
Figure 7C:
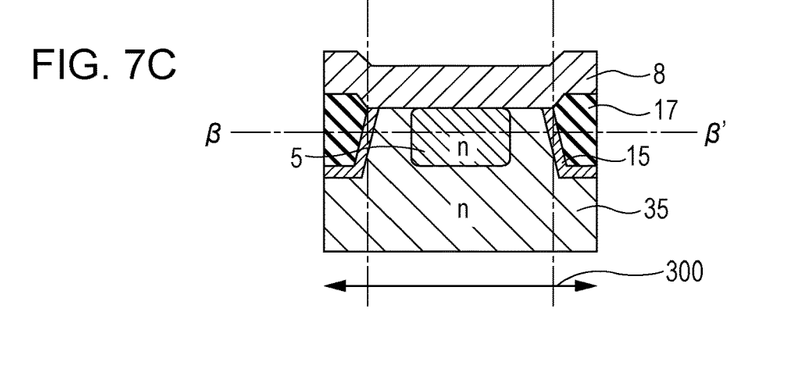

With reference to FIGS. 7A to 7C, a fourth exemplary embodiment will be described. This exemplary embodiment is different from the first exemplary embodiment in that the widths of the n-type region 3 and the n-type region 5 are equal.

FIG. 7A is a plan view of a pixel, and FIGS. 7B and 7C are cross-section views taken at lines VIIB-VIIB and VIIC-VIIC, respectively, in FIG. 7A.

In the pixel structure at line α-α' illustrated in FIG. 7B, the photoelectric conversion portion 2 has the n-type region 3 and n-type region 30 as an n-type region and the p-type region 15 as a p-type region. In the pixel structure taken at line β-β' illustrated in FIG. 7C, the n-type region includes the n-type region 5 and n-type region 35, and the p-type region is the p-type region 15.

It may be expressed here that, in the structures illustrated in FIGS. 7B and 7C, the n-type region 3 (first semiconductor region) and the n-type region 5 (second semiconductor region) are placed between the p-type regions 15 (third semiconductor regions) in the cross section in the channel width direction of the first transfer transistor. It may further be expressed that the n-type region 30 (fourth semiconductor region) is placed between the p-type region 15 (third semiconductor region) and the n-type region 3 (first semiconductor region). Furthermore, it may be expressed that the n-type region 35 (fifth semiconductor region) is placed between the p-type region 15 (third semiconductor region) and the n-type region 5 (second semiconductor region).

According to this exemplary embodiment, the n-type region 3 (first semiconductor region) and n-type region 5 (second semiconductor region) in the photoelectric conversion portion have an equal width, but the width of the n-type region 35 (fifth semiconductor region) in the electric-carrier accumulation portion is larger than the width of the n-type region 30 (fourth semiconductor region) in the photoelectric conversion portion. Thus, with respect to the total width of the n-type region, because the width in the electric-carrier accumulation portion is larger than the width in the photoelectric conversion portion, the efficiency of the electric carrier transfer from the photoelectric conversion portion to the electric-carrier accumulation portion can be improved.

According to this exemplary embodiment, the widths of the p-type region 15 are substantially equal in the photoelectric conversion portion 2 and in the electric-carrier accumulation portion 4 in a cross section in the channel width direction of the first transfer transistor. Therefore, the width of the active region 1 can be used as a proxy variable for the width of the n-type region. Therefore, in planer view, a larger width of an active region in the electric carriers accumulating unit under the gate of the first transfer transistor than the width of an active region in the photoelectric conversion portion can improve the efficiency of the electric carrier transfer from the photoelectric conversion portion to the electric-carrier accumulation portion.

Fifth Exemplary Embodiment

With reference to FIG. 8 and FIGS. 9A to 9D, a fifth exemplary embodiment will be described. This exemplary embodiment is different from the first exemplary embodiment in that the active region 1 has a stepped shape instead of a tapered shape.

Figure 8:
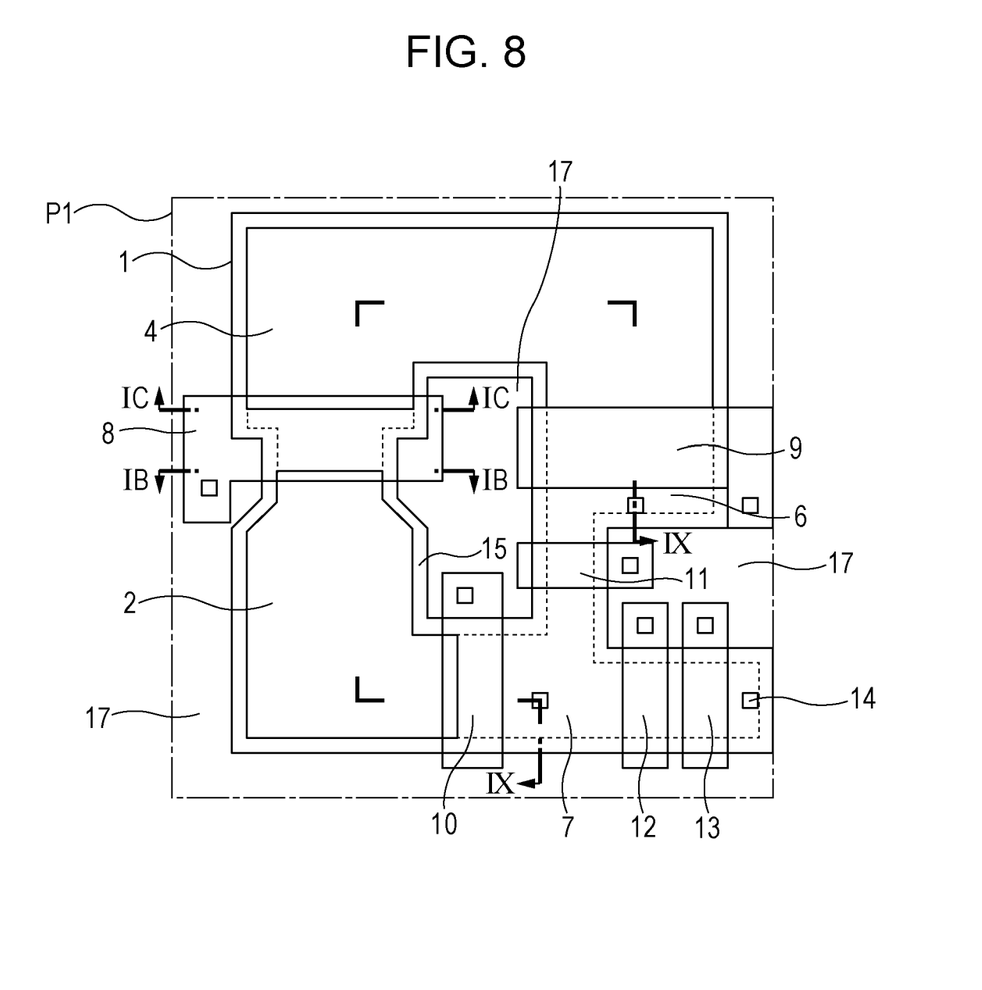
FIG. 8 is a pixel plan view according to the fourth exemplary embodiment.
Figure 9A:
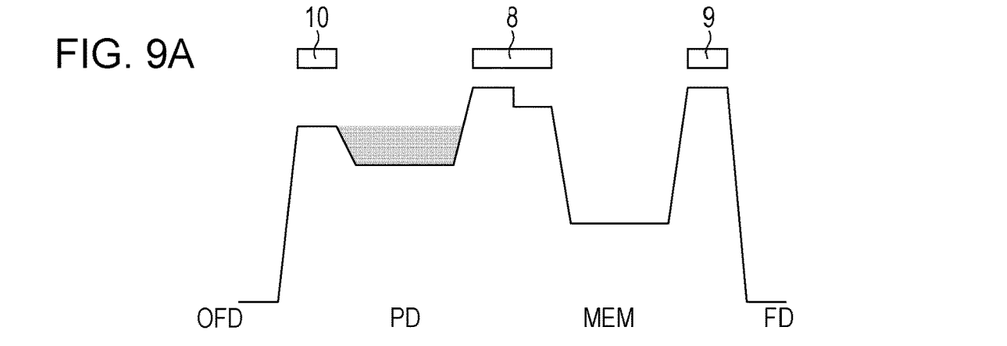
FIGS. 9A to 9D illustrate potential cross-section views according to the fourth exemplary embodiment.
Figure 9B:
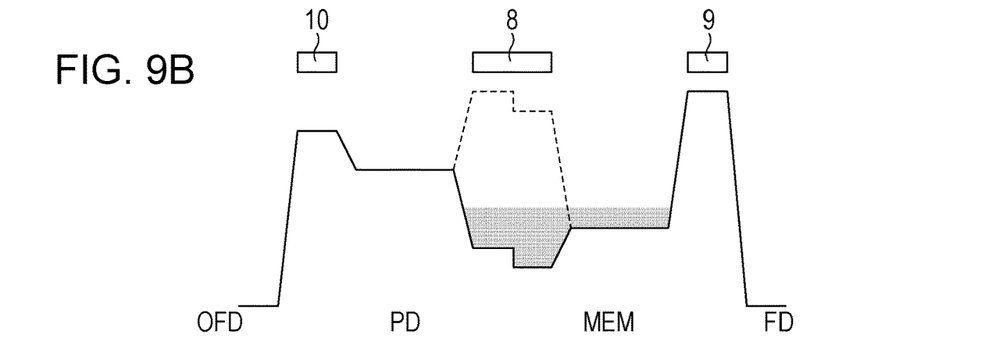
Figure 9C:
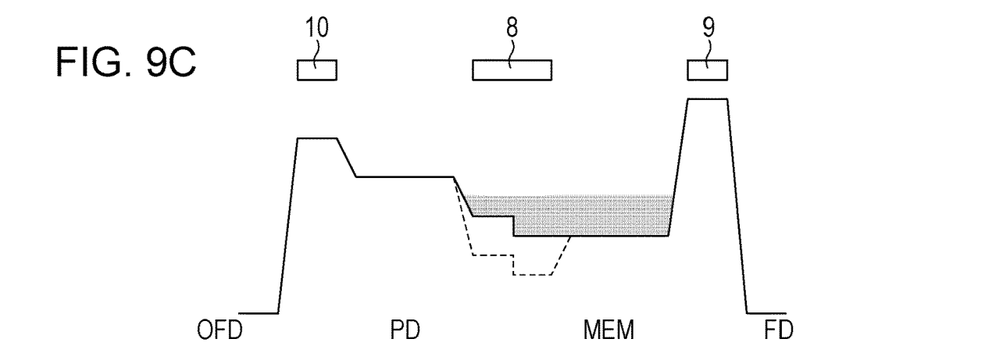
Figure 9D:
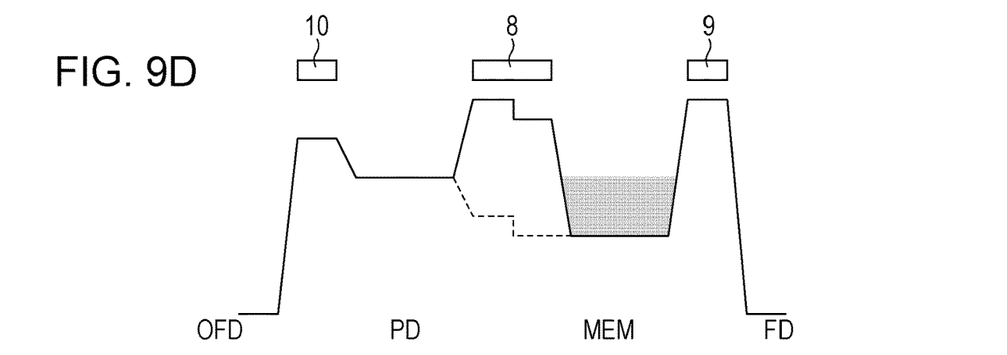

FIG. 8 is a plan view of a pixel, and FIGS. 9A to 9D are potential schematic diagram taken at IX-IX in FIG. 8. The cross section view taken at line IB-IB in FIG. 8 has the same configuration as that in FIG. 1B. The cross section view taken at line IC-IC in FIG. 8 has the same configuration as that in FIG. 1C.

Though the potential gradients illustrated in FIGS. 9A to 9D are different from the potential gradients illustrated in FIGS. 2A to 2D according to the first exemplary embodiment, a potential structure is provided which has a high potential in the photoelectric conversion portion 2 and a low potential in the electric-carrier accumulation portion 4. This can improve the efficiency of the electric carrier transfer from the photoelectric conversion portion to the electric-carrier accumulation portion.

Sixth Exemplary Embodiment

Figure 10A:
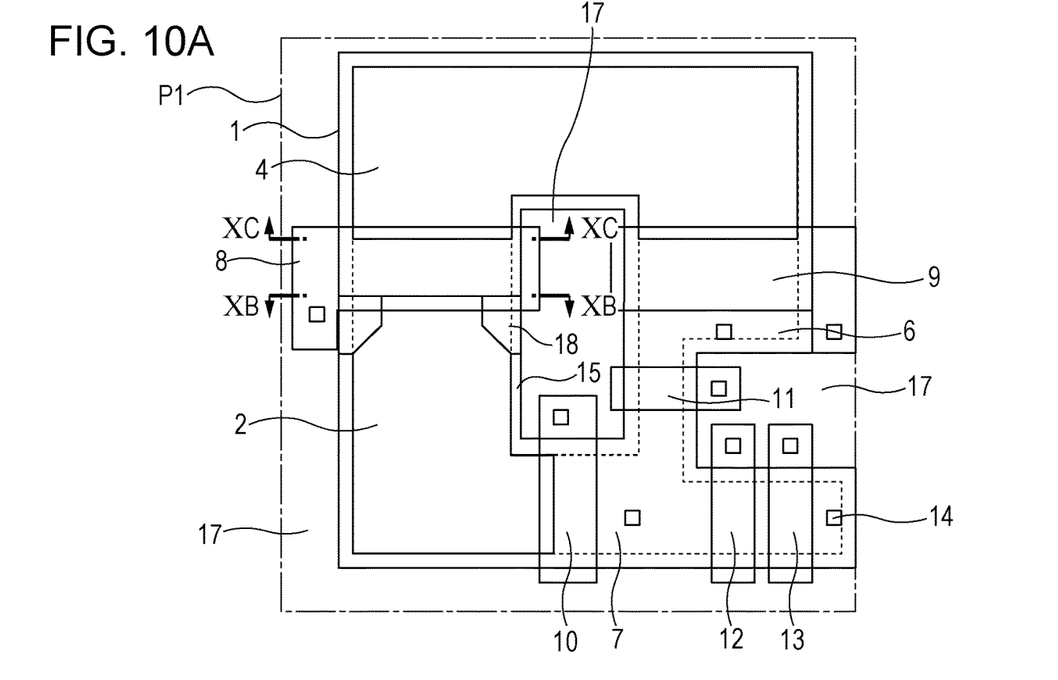
FIGS. 10A to 10C illustrate a pixel plan view and cross-section views according to a fifth exemplary embodiment.
Figure 10B:
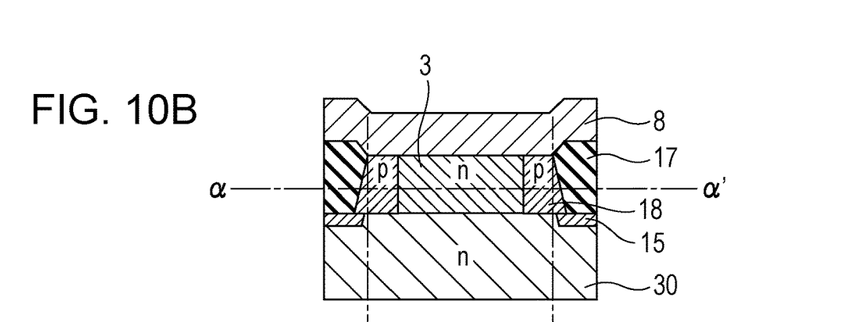
Figure 10C:
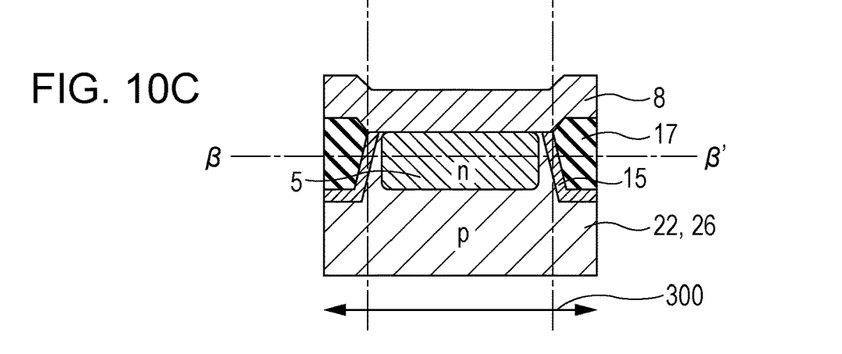

With reference to FIGS. 10A to 10C, a sixth exemplary embodiment will be described. This exemplary embodiment is different from the first exemplary embodiment in that a p-type region 18 is further provided for adjusting the channel width at side ends of the photoelectric conversion portion 2. They are further different in that, in planer view, the active region 1 under the gate of the first transfer transistor has widths which are equal in the photoelectric conversion portion 2 and in the electric-carrier accumulation portion 4.

FIG. 10A is a plan view of a pixel, and FIGS. 10B and 10C are cross sections taken at lines XB-XB and XC-XC, respectively, in FIG. 10A.

Referring to FIGS. 10A to 10C, the p-type region 18 different from the p-type region 15 is provided on a side surface of the active region 1 in contact with the element isolation region 17. The pixel structure taken at line α-α' illustrated in FIG. 10B has the n-type region 3 as an n-type region and the p-type region 18 and p-type region 15 as a p-type region. The pixel structure taken at line β-β' illustrated in FIG. 10C has the n-type region 5 as an n-type region and the p-type region 15 and p-type region 26 as a p-type region.

It may be expressed here that the n-type region 3 (first semiconductor region) and the n-type region 5 (second semiconductor region) are placed between the p-type regions 15 (third semiconductor regions) in the cross section in the channel width direction of the first transfer transistor in the structures illustrated in FIGS. 10B and 10C. It may further be expressed that the n-type region 3 (first semiconductor region) is placed between the p-type regions 18.

According to this exemplary embodiment, the width of the n-type region 5 in the electric-carrier accumulation portion is larger than the width of the n-type region 3 in the photoelectric conversion portion in the cross section in the channel width direction of the first transfer transistor under the gate of the first transfer transistor. This can improve the efficiency of the electric carrier transfer from the photoelectric conversion portion to the electric-carrier accumulation portion.

Having described the plurality of exemplary embodiments, the configurations of the exemplary embodiments may be combined as required.

The region "under the gate of the first transfer transistor" may include a region substantially under the gate of the first transfer transistor. As long as signal electric carriers are transferred from the photoelectric conversion portion to the electric-carrier accumulation portion when the first transfer transistor has an ON state, a semiconductor region may be placed at a position offset from directly below the gate of the first transfer transistor.

Furthermore, the aforementioned exemplary embodiments may be applicable to a camera incorporating a solid-state imaging apparatus, for example. The concept of the camera here includes not only apparatuses usable mainly for imaging but also apparatus auxiliary including an imaging function (such as a personal computer and a mobile terminal). The cameras include a solid-state imaging apparatus according to the present invention illustrated as any one of the aforementioned exemplary embodiments and a processing unit configured to process a signal output from the solid-state imaging apparatus. The processing unit may include an A/D converter, and a processor configured to process digital data output from the A/D converter, for example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion apparatus in which a plurality of pixels are laid out in a matrix form, each of the pixels having an imaging region having a photoelectric conversion portion, a first transfer transistor configured to transfer electric carriers from the photoelectric conversion portion, an electric-carrier accumulation portion to which the electric carriers are transferred from the first transfer transistor, a second transfer transistor configured to transfer electric carriers accumulated in the electric-carrier accumulation portion, and a floating diffusion to which the electric carriers are transferred from the second transfer transistor, the solid-state imaging apparatus comprising:
   an active region having the photoelectric conversion portion, the electric-carrier accumulation portion, and the floating diffusion; and
   an element isolation region having an insulator defining the active region;
   wherein, in a predetermined direction in plan view, a first total length from a first boundary where the element isolation region contacts the active region to a second boundary where the element isolation region contacts the active region in the electric-carrier accumulation portion under a gate of the first transfer transistor is larger than a second total length from a third boundary where the element isolation region contacts the active region to a fourth boundary where the element isolation region contacts the active region in the photoelectric conversion portion under the gate of the first transfer transistor, and
   wherein, in the predetermined direction in plan view, the active region having the photoelectric conversion portion has a third total length from a fifth boundary where the element isolation region contacts the active region to a sixth boundary where the element isolation region contacts the active region that is larger than the second total length.

2. The photoelectric conversion apparatus according to claim 1, wherein, when the first transfer transistor is turned on, the potential for the electric carriers under the gate of first transfer transistor is lower in the electric-carrier accumulation portion than that in the photoelectric conversion portion.

3. The photoelectric conversion apparatus according to claim 1, wherein, in plan view, the active region has a semiconductor region of a second conductivity type extending along the boundary between the active region and the element isolation region.

4. The photoelectric conversion apparatus according to claim 1, wherein, in plan view, a fourth total length from a seventh boundary where the element isolation region contacts the active region to an eighth boundary where the element isolation region contacts the active region in the electric-carrier accumulation portion under the second transfer transistor is larger than a fifth total length from a ninth boundary where the element isolation region contacts the active region to a tenth boundary where the element isolation region contacts the active region in the floating diffusion under the second transfer transistor.

5. The photoelectric conversion apparatus according to claim 1,
   wherein the gate of the first transfer transistor has a first end portion,
   wherein a gate of the second transfer transistor has a second end portion opposite to the first end portion, and
   wherein, in plan view, the insulator is provided between the first end portion and the second end portion.

6. A photoelectric conversion apparatus comprising:
   a photoelectric conversion portion having a first semiconductor region of a first conductivity type;
   a first transfer transistor configured to transfer electric carriers from the photoelectric conversion portion;
   an electric-carrier accumulation portion having a second semiconductor region of the first conductivity type, the electric-carrier accumulating portion receiving the electric carriers transferred from the first transfer transistor;
   a second transfer transistor configured to transfer electric carriers accumulated in the electric-carrier accumulation portion;
   a floating diffusion to which the electric carriers are transferred from the second transfer transistor;
   wherein, at a side where the photoelectric conversion portion is provided, the first semiconductor region is placed between a third semiconductor region of a second conductivity type which is different from the first conductivity type and a fourth semiconductor region of the second conductivity type in a cross section in a channel width direction of the first transfer transistor under the gate of the first transfer transistor,
   wherein, at a side where the electric-carrier accumulation portion is provided, the second semiconductor region is placed between a fifth semiconductor region of the second conductivity type and a sixth semiconductor region of the second conductivity type in a cross section in the channel width direction of the first transfer transistor under the gate of the first transfer transistor,
   wherein a first total length of a first line from a first boundary where the second semiconductor region contacts the fifth semiconductor region to a second boundary where the second semiconductor region contacts the sixth semiconductor region is larger than a second total length of a second line from a third boundary where the first semiconductor region contacts the third semiconductor region to a fourth boundary where the first semiconductor region contacts the fourth semiconductor region in a cross section in the channel width direction of the first transfer transistor and wherein, in the channel width direction of the first transfer transistor in plan view, the first semiconductor region has a third total length of a third line from a fifth boundary where the first semiconductor region contacts the third semiconductor region to a sixth boundary where the first semiconductor region contacts the fourth semiconductor region that is larger than the second total length, wherein, the first boundary, the second boundary, the third boundary, and the fourth boundary are located under the gate of the first transfer transistor, and wherein the first line is parallel to the second line, and the second line is parallel to the third line.

7. The photoelectric conversion apparatus according to claim 6, wherein the photoelectric conversion portion further has a semiconductor region of the second conductivity type in contact with an upper surface of the first semiconductor region, and a semiconductor region of the first conductivity type in contact with a lower surface of the first semiconductor region.

8. The photoelectric conversion apparatus according to claim 6, wherein the photoelectric conversion portion further has a semiconductor region of the second conductivity type in contact with an upper surface of the first semiconductor region, and a semiconductor region of the second conductivity type in contact with a lower surface of the first semiconductor region.

9. The photoelectric conversion apparatus according to claim 6, wherein the electric-carrier accumulation portion further has a semiconductor region of the second conductivity type in contact with an upper surface of the second semiconductor region, and a semiconductor region of the second conductivity type in contact with a lower surface of the second semiconductor region.

10. The photoelectric conversion apparatus according to claim 6, wherein, in plan view, a semiconductor region of the second conductivity type extends from the photoelectric conversion portion to the electric-carrier accumulation portion.

11. The photoelectric conversion apparatus according to claim 10, wherein the second semiconductor region in a cross section in the channel width direction of the first transfer transistor under the gate of the first transfer transistor is placed between semiconductor regions of the second conductivity type different from the third semiconductor regions.

12. The photoelectric conversion apparatus according to claim 6, wherein the first conductivity type is an n-type, and the second conductivity type is a p-type.

13. The photoelectric conversion apparatus according to claim 6, further comprising:
an active region having the photoelectric conversion portion, the electric-carrier accumulation portion, and the floating diffusion; and
an element isolation region having an insulator defining the active region;
wherein, in plan view, a fourth total length from a seventh boundary where the element isolation region contacts the active region to an eighth boundary where the element isolation region contacts the active region in the electric-carrier accumulation portion under the second transfer transistor is larger than a fifth total length from a ninth boundary where the element isolation region contacts the active region to a tenth boundary where the element isolation region contacts the active region in the floating diffusion under the second transfer transistor.

* * * * *